(12) United States Patent
Nakagawa (10) Patent No.: US 11,239,876 B2
(45) Date of Patent: Feb. 1, 2022

(54) HIGH-FREQUENCY MODULE AND COMMUNICATION DEVICE

(71) Applicant: Murata Manufacturing Co., Ltd., Kyoto (JP)

(72) Inventor: Dai Nakagawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 356 days.

(21) Appl. No.: 16/595,548

(22) Filed: Oct. 8, 2019

(65) Prior Publication Data

US 2020/0044683 A1 Feb. 6, 2020

Related U.S. Application Data

(63) Continuation of application No. PCT/JP2018/019336, filed on May 18, 2018.

(30) Foreign Application Priority Data

Jun. 2, 2017 (JP) .............................. JP2017-110366

(51) Int. Cl.
 *H05K 1/02* (2006.01)
 *H05K 1/18* (2006.01)
 (Continued)

(52) U.S. Cl.
 CPC ............... *H04B 1/50* (2013.01); *H01L 23/28* (2013.01); *H01L 23/5383* (2013.01);
 (Continued)

(58) Field of Classification Search
 CPC ...... H05K 1/0219; H05K 1/0237; H05K 1/18; H04B 1/50; H01L 23/28; H01L 23/5383; H01L 23/66
 See application file for complete search history.

(56) References Cited

U.S. PATENT DOCUMENTS

2004/0203552 A1 10/2004 Horiuchi et al.
2005/0088260 A1* 4/2005 Ajioka ................... H01L 23/66
 333/247
(Continued)

FOREIGN PATENT DOCUMENTS

JP H05-63388 A 3/1993
JP 2004-297456 A 10/2004
(Continued)

OTHER PUBLICATIONS

International Search Report for International Application No. PCT/JP2018/019336, dated Aug. 7, 2018.
(Continued)

*Primary Examiner* — Hoa C Nguyen
(74) *Attorney, Agent, or Firm* — Pearne & Gordon LLP (57) ABSTRACT

A high-frequency module (100) includes a multilayer board (110) including a plurality of insulator layers and at least one ground conductor layer (113); in the multilayer board (110), a transmission circuit (120) that is a first circuit provided in a first region and an antenna circuit (130) that is a second circuit provided in a second region different from the first region; and shielding conductor films (151 to 156) provided on sides of the multilayer board (110) and being partially in contact with the ground conductor layer (113). The ground conductor layer (113) is not in contact with the shielding conductor films (151 to 156) in, of a side of the multilayer board (110), a portion that is closest both to the first region and to the second region.

13 Claims, 4 Drawing Sheets

(51) Int. Cl.
*H04B 1/50* (2006.01)
*H01L 23/28* (2006.01)
*H01L 23/538* (2006.01)
*H01L 23/66* (2006.01)
*H01P 1/20* (2006.01)
*H04B 1/00* (2006.01)
*H05K 9/00* (2006.01)

(52) U.S. Cl.
CPC .............. *H01L 23/66* (2013.01); *H01P 1/20* (2013.01); *H04B 1/0057* (2013.01); *H05K 1/0219* (2013.01); *H05K 1/0237* (2013.01); *H05K 1/18* (2013.01); *H05K 9/0039* (2013.01)

(56) References Cited

U.S. PATENT DOCUMENTS

| | | | | |
|---|---|---|---|---|
| 2005/0201971 | A1* | 9/2005 | Janardanan Nair | G06Q 30/0241 424/76.1 |
| 2007/0023203 | A1* | 2/2007 | Leizerovich | H05K 1/0218 174/255 |
| 2009/0302414 | A1* | 12/2009 | Ebefors | B81C 1/00246 257/506 |
| 2011/0248389 | A1* | 10/2011 | Yorita | H01L 25/0652 257/659 |
| 2012/0008288 | A1* | 1/2012 | Tsukamoto | H01L 23/552 361/736 |
| 2015/0062835 | A1* | 3/2015 | Kai | H05K 9/003 361/748 |
| 2015/0119102 | A1* | 4/2015 | Saji | H05K 9/0045 455/550.1 |
| 2017/0179041 | A1* | 6/2017 | Dias | H01L 21/31111 |
| 2017/0347462 | A1* | 11/2017 | Miwa | H05K 3/284 |
| 2018/0261551 | A1* | 9/2018 | Lee | H01L 25/16 |
| 2018/0301420 | A1* | 10/2018 | Kim | H01L 23/66 |
| 2018/0331043 | A1* | 11/2018 | Zhang | H01L 23/48 |

FOREIGN PATENT DOCUMENTS

| | | |
|---|---|---|
| JP | 2008-219453 A | 9/2008 |
| JP | 2011-187779 A | 9/2011 |
| JP | 2012-019091 A | 1/2012 |

OTHER PUBLICATIONS

Written Opinion for International Application No. PCT/JP2018/019336, dated Aug. 7, 2018.

* cited by examiner

HIGH-FREQUENCY MODULE AND COMMUNICATION DEVICE

This is a continuation of International Application No. PCT/JP2018/019336 filed on May 18, 2018 which claims priority from Japanese Patent Application No. 2017-110366 filed on Jun. 2, 2017. The contents of these applications are incorporated herein by reference in their entireties.

BACKGROUND OF THE DISCLOSURE

Field of the Disclosure

The present disclosure relates to a high-frequency module and a communication device.

Description of the Related Art

In the related art, there is a high-frequency module (for example, Patent Document 1) including a plurality of electronic components mounted on an upper surface of a printed circuit board, a resin portion covering the plurality of electronic components, a shielding metal film formed on at least a part of a side of the printed circuit board and a surface of the resin portion, and a ground pattern connected to the shielding metal film at the side of the printed circuit board. The shielding metal film keeps high-frequency noise from leaking to the outside or entering the high-frequency module.

Patent Document 1: Japanese Unexamined Patent Application Publication No. 2011-187779

BRIEF SUMMARY OF THE DISCLOSURE

However, in some cases, a shielding conductor film forms an unintended signal path in the high-frequency module (specifically, between a plurality of circuits provided in the high-frequency module) and deteriorates the circuit characteristics of the high-frequency module.

Thus, the present disclosure aims to provide a high-frequency module that is excellent both in high-frequency noise suppression and in circuit characteristics.

To achieve the above-described aim, a high-frequency module according to one aspect of the present disclosure includes a multilayer board including a plurality of insulator layers and at least one ground conductor layer; a first circuit provided in a first region in the multilayer board; a second circuit provided in a second region, which is a region different from the first region, in the multilayer board; and a shielding conductor film provided on a side of the multilayer board and being partially in contact with the ground conductor layer. The ground conductor layer is not in contact with the shielding conductor film in, of the side of the multilayer board, a portion that is closest both to the first region and to the second region.

Within the high-frequency module, it has been learned that an unintended signal path is likely to be formed in a portion where the ground conductor layer and the shielding conductor film are in contact with each other. Thus, in the above-described configuration, when the ground conductor layer and the shielding conductor film are kept from coming into contact with each other in, of the side of the multilayer board, the portion that is closest both to the first region and to the second region, the strength of the ground, that is, impedance is adjusted, thereby keeping an unintended signal path from being formed between the first circuit and the second circuit.

This allows the high-frequency module to be obtained that inhibits deterioration in circuit characteristics caused by unintended signal transmission and is excellent in circuit characteristics.

Furthermore, the first circuit may be a transmission circuit, and the second circuit may be an antenna circuit.

If unintended signal transmission occurs between the transmission circuit and the antenna circuit, for example, a transmission signal including a harmonic wave before being subjected to filter processing is transmitted from the transmission circuit directly to the antenna circuit, and a concern arises about deterioration in spurious characteristics.

In this respect, the above-described configuration can inhibit unintended signal transmission between the transmission circuit and the antenna circuit and can therefore inhibit, for example, deterioration in circuit characteristics, such as spurious characteristics.

Furthermore, the first circuit may be a transmission circuit, and the second circuit may be a reception circuit.

If unintended signal transmission occurs between the transmission circuit and the reception circuit, for example, a transmission signal is transmitted from the transmission circuit to the reception circuit, and a concern arises about deterioration in isolation characteristics.

In this respect, the above-described configuration can inhibit unintended signal transmission between the transmission circuit and the reception circuit and can therefore inhibit, for example, deterioration in circuit characteristics, such as isolation characteristics.

Furthermore, the transmission circuit may include a transmission filter, the reception circuit may include a reception filter, and the transmission filter and the reception filter may be built into a single duplexer component. The portion may be a part of the side of the multilayer board to which the duplexer component is closest. A length of the portion may be longer than a length of a side of the duplexer component opposite to the portion.

This configuration can keep the ground conductor layer from coming into contact with the shielding conductor film along the entire length of the duplexer component and can therefore inhibit unintended signal transmission between the transmission filter and the reception filter that are included in the duplexer component more effectively and inhibit deterioration in circuit characteristics.

Furthermore, the shielding conductor film does not have to be formed in the portion of the side of the multilayer board.

This configuration inhibits not only unintended signal transmission that occurs through the ground conductor layer but also unintended signal transmission that occurs through the shielding conductor film and can therefore inhibit deterioration in circuit characteristics more effectively.

A communication device according to one aspect of the present disclosure includes the high-frequency module; and an RF signal processing circuit connected to the high-frequency module.

This configuration allows the communication device to be obtained that is excellent in circuit characteristics on the basis of effects of the above-described high-frequency module.

The high-frequency module and the communication device according to the present disclosure allow a high-frequency module that is excellent both in high-frequency noise suppression and in circuit characteristics and a communication device using such a high-frequency module to be obtained.

DETAILED DESCRIPTION OF THE DISCLOSURE

Embodiments of the present disclosure will be described in detail below with reference to the drawings. Note that all of the embodiments described below describe comprehensive or specific examples. Numerical values, shapes, materials, components, the arrangement and connection configuration of the components, and so forth that are described in the following embodiments are merely examples and are not intended to limit the present disclosure. Among the components in the following embodiments, a component not described in an independent claim is described as an optional component. Furthermore, the sizes or size ratio of components illustrated in the drawings are or is not necessarily exact.

First Embodiment

Figure 1:
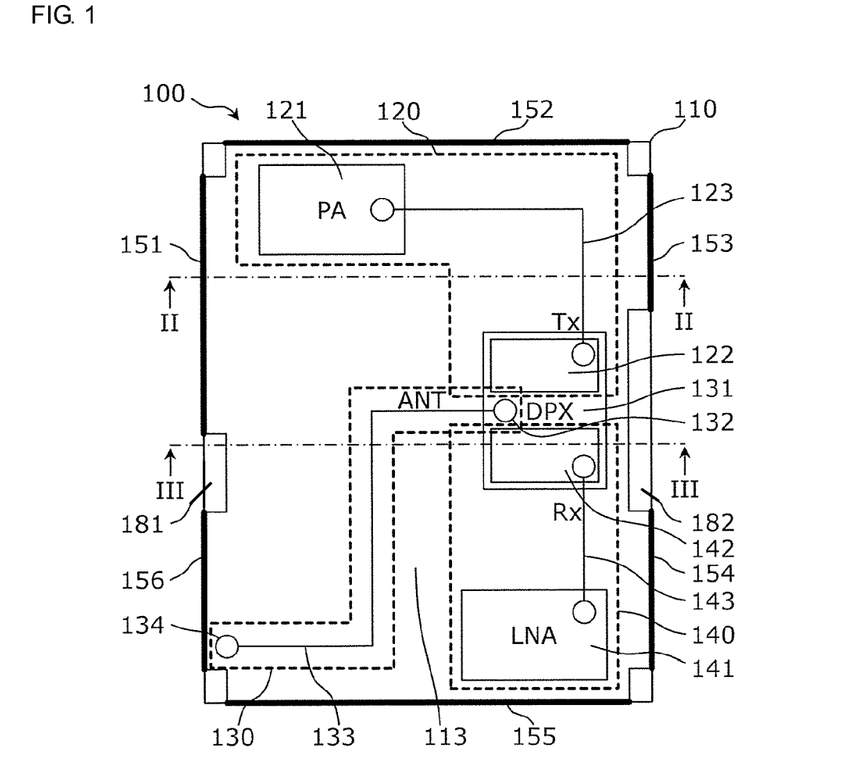
FIG. 1 is a plan view illustrating an example of a structure of a high-frequency module according to an embodiment.

FIG. 1 is a plan view illustrating an example of a structure of a high-frequency module according to a first embodiment.

Figure 2:
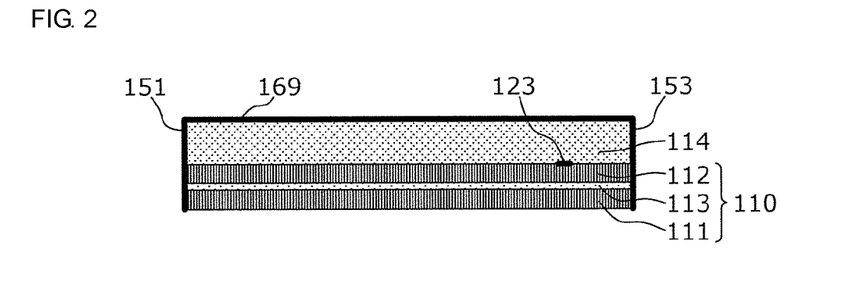
FIG. 2 is a cross-sectional view illustrating an example of the structure of the high-frequency module according to the embodiment.
Figure 3:
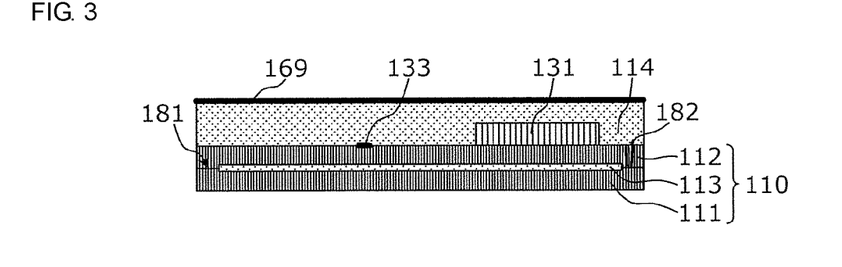
FIG. 3 is a cross-sectional view illustrating an example of the structure of the high-frequency module according to the embodiment.

FIGS. 2 and 3 are cross-sectional views illustrating an example of the structure of the high-frequency module according to the first embodiment. The cross-sectional view in FIG. 2 corresponds to a cross section taken along line II-II in FIG. 1 as viewed in the direction of the arrows, and the cross-sectional view in FIG. 3 corresponds to a cross section taken along line III-III in FIG. 1 as viewed in the direction of the arrows.

As illustrated in FIGS. 1 to 3, a high-frequency module 100 includes a power amplifier 121, a duplexer 131, and a low noise amplifier 141 that are mounted on a multilayer board 110, and includes a connection terminal 134 for inputting and outputting antenna signals.

The power amplifier 121 and the duplexer 131 are connected with a wiring pattern 123. The duplexer 131 and the connection terminal 134 are connected with a wiring pattern 133. A terminal of the duplexer 131 connected to the connection terminal 134 is called an antenna terminal 132. The low noise amplifier 141 and the duplexer 131 are connected with a wiring pattern 143.

The power amplifier 121 is configured with a semiconductor element. The power amplifier 121 amplifies a transmission RF signal Tx in a transmission frequency band received through a signal terminal, which is not illustrated, and supplies the amplified transmission RF signal Tx to the duplexer 131.

The duplexer 131 is a composite component into which a transmission filter 122 and a reception filter 142 are built. The transmission filter 122 removes a harmonic component included in the transmission RF signal Tx amplified by the power amplifier 121 and supplies the transmission RF signal Tx from which the harmonic component has been removed to an antenna circuit. The reception filter 142 extracts a signal component in a reception frequency band included in a signal supplied from the antenna circuit and supplies the extracted signal component as a reception RF signal Rx to the low noise amplifier 141.

The low noise amplifier 141 is configured with a semiconductor element. The low noise amplifier 141 amplifies the reception RF signal Rx supplied from the duplexer 131 and supplies the amplified reception RF signal Rx to an external circuit through a signal terminal, which is not illustrated.

Each of the power amplifier 121, the duplexer 131, and the low noise amplifier 141 may be constituted by an independent single chip component.

A circuit including the power amplifier 121, the transmission filter 122, and the wiring pattern 123 is an example of a transmission circuit, and the transmission circuit is formed in a region 120.

Furthermore, a circuit including the antenna terminal 132 of the duplexer 131, the wiring pattern 133, and the connection terminal 134 is an example of the antenna circuit, and the antenna circuit is formed in a region 130.

Furthermore, a circuit including the low noise amplifier 141, the reception filter 142, and the wiring pattern 143 is an example of a reception circuit, and the reception circuit is formed in a region 140.

In the example illustrated in FIG. 1, the regions in which the transmission circuit, the antenna circuit, and the reception circuit are formed are polygon regions in which all elements constituting each circuit are included when the multilayer board 110 is viewed in plan.

The multilayer board 110 includes insulator layers 111 and 112, and a ground conductor layer 113. Although, as an example, the ground conductor layer 113 is disposed between the insulator layers 111 and 112, the disposition of the ground conductor layer 113 is not limited to this example. The ground conductor layer 113 may be disposed on a lower surface of the insulator layer 111, or may be disposed on an upper surface of the insulator layer 112.

A resin layer 114 is provided on an upper surface of the multilayer board 110. The power amplifier 121, the duplexer 131, and the low noise amplifier 141 are sealed with the resin layer 114.

Shielding conductor films 151 to 156 are provided to continuously cover the sides of the multilayer board 110 and the sides of the resin layer 114. A shielding conductor film 169 is provided on the top surface of the resin layer 114.

The ground conductor layer 113 is partially in contact with the shielding conductor films 151 to 156. The ground conductor layer 113 is not in contact with the shielding conductor films 151 to 156 in a portion of the side of the multilayer board 110 closest both to a first region in which a first circuit is formed and to a second region in which a second circuit is formed.

In the example illustrated in FIG. 1, the ground conductor layer 113 is not in contact with the shielding conductor films 151 to 156 in a portion of the side of the multilayer board 110 closest both to the region 120 in which the transmission circuit is formed and to the region 130 in which the antenna circuit is formed. Here, the portion closest both to the region 120 and to the region 130 refers to, for example, a portion of the side of the multilayer board 110 in which the sum of the shortest distance to the region 120 and the shortest distance to the region 130 is minimum. In FIG. 1, a slit 181 provided in a left-hand side is an example of the portion.

Furthermore, the ground conductor layer 113 is not in contact with the shielding conductor films 151 to 156 in a portion of the side of the multilayer board 110 closest both to the region 120 in which the transmission circuit is formed and to the region 140 in which the reception circuit is formed. Here, the portion closest both to the region 120 and to the region 140 refers to, for example, a portion of the side of the multilayer board 110 in which the sum of the shortest distance to the region 120 and the shortest distance to the region 140 is minimum. In FIG. 1, a slit 182 provided in a right-hand side is an example of the portion.

When the multilayer board 110 is viewed in plan, the slits 181 and 182 are regions that are created between the outer edges of the ground conductor layer 113 positioned away from the sides of the multilayer board 110 and the sides of the multilayer board 110 and that have no ground conductor layer 113. Within the slits 181 and 182, the insulator layers 111 and 112 are directly joined without the ground conductor layer 113 interposed therebetween.

When viewed from another angle, the slit 182 is a part of the side of the multilayer board 110 to which the duplexer 131 including the transmission filter 122 and the reception filter 142 is closest. When the multilayer board 110 is viewed in plan, a length of the slit 182, that is, of the side of the multilayer board 110, a length of a portion in which the outer edge of the ground conductor layer 113 is not in contact with the shielding conductor films 151 to 156 is longer than a length of the side of the duplexer 131 opposite to the slit 182.

In the high-frequency module 100, in a portion of the side of the multilayer board 110 closest both to the region 120 in which the transmission circuit is formed and to the region 130 in which the antenna circuit is formed, the ground conductor layer 113 is not in contact with the shielding conductor films 151 to 156. Thus, the strength of the ground, that is, impedance is adjusted, thereby making it possible to keep an unintended signal path from being formed between the transmission circuit and the antenna circuit.

In particular, if unintended signal transmission occurs between the transmission circuit and the antenna circuit, for example, a transmission signal including a harmonic wave before being subjected to filter processing is transmitted from the transmission circuit directly to the antenna circuit, and a concern arises about deterioration in spurious characteristics.

In this respect, the above-described configuration can inhibit unintended signal transmission between the transmission circuit and the antenna circuit by keeping a part of the ground conductor layer 113 from coming into contact with the shielding conductor films 151~156 and can therefore inhibit, for example, deterioration in circuit characteristics, such as spurious characteristics.

Furthermore, in a portion of the side of the multilayer board 110 closest both to the region 120 in which the transmission circuit is formed and to the region 140 in which the reception circuit is formed, the ground conductor layer 113 and the shielding conductor films 151 to 156 are kept from coming into contact with each other. Thus, the strength of the ground, that is, impedance is adjusted, thereby making it possible to keep an unintended signal path from being formed between the transmission circuit and the reception circuit.

In particular, if unintended signal transmission occurs between the transmission circuit and the reception circuit, for example, a transmission signal is transmitted from the transmission circuit to the reception circuit, and a concern arises about deterioration in isolation characteristics.

In this respect, the above-described configuration can inhibit unintended signal transmission between the transmission circuit and the reception circuit by keeping a part of the ground conductor layer 113 from coming into contact with the shielding conductor films 151~156 and can therefore inhibit, for example, deterioration in circuit characteristics, such as isolation characteristics.

As a result, the high-frequency module is obtained that inhibits deterioration in circuit characteristics caused by unintended signal transmission between the transmission circuit and the reception circuit and is excellent in the circuit characteristics.

Next, three-dimensional shapes and dispositions of the ground conductor layer 113, the shielding conductor films 151 to 156 and 169, and the slits 181 and 182 will be described.

Figure 4:
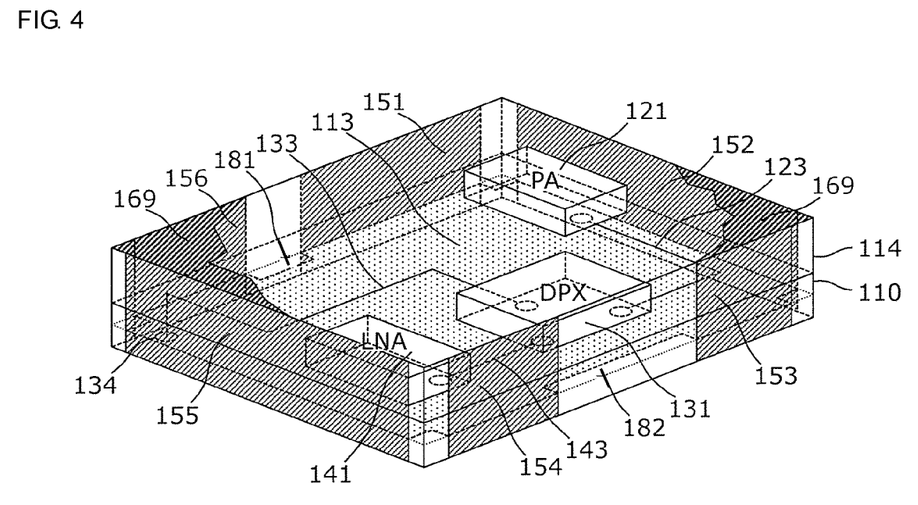
FIG. 4 is a perspective view illustrating an example of the structure of the high-frequency module according to the embodiment.

FIG. 4 is a perspective view illustrating an example of the structure of the high-frequency module 100. For convenience of understanding, in FIG. 4, the multilayer board 110 and the resin layer 114 are made transparent, and the ground conductor layer 113, and the shielding conductor films 151 to 156 and 169 are represented. Some parts of the shielding conductor film 169 are omitted, and the ground conductor layer 113, the shielding conductor films 151 to 156, and the shielding conductor film 169 are distinguished by gray colors with respective different densities.

Some parts of the ground conductor layer 113 reach the sides of the multilayer board 110 and are in contact with the shielding conductor films 151 to 156. Other parts of outer edges of the ground conductor layer 113 are positioned away from the sides of the multilayer board 110 and are not in contact with the sides of the multilayer board 110, and the slits 181 and 182 are formed between the outer edges of the ground conductor layer 113 and the sides of the multilayer board 110.

The shielding conductor films 151 to 156 are continuously formed to extend from the sides of the multilayer board 110 to the sides of the resin layer 114 and are further connected to the shielding conductor film 169 on the top surface of the resin layer 114. The shielding conductor film 169 is provided on the whole area of the top surface of the resin layer 114, and some parts thereof are omitted in the figure.

Of the sides of the multilayer board 110, in portions of sides in which the ground conductor layer 113 is away from portions, that is, in portions of sides in which the slits 181 and 182 are formed, no shielding conductor film is formed.

Figure 5:
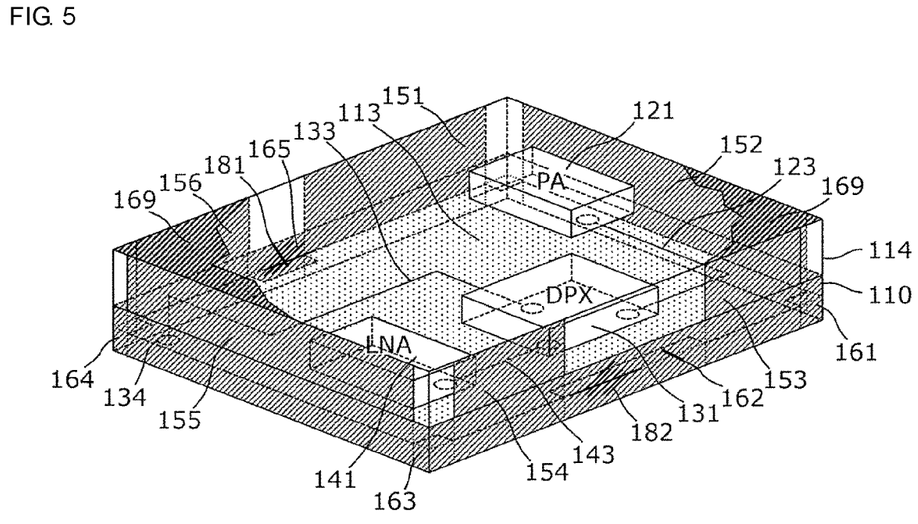
FIG. 5 is a perspective view illustrating an example of the structure of the high-frequency module according to the embodiment.

FIG. 5 is a perspective view illustrating another example of the structure of the high-frequency module 100. The structure in FIG. 5 differs from the structure in FIG. 4 only in that shielding conductor films 161 to 165 are added to form shielding conductor films all around the sides of the multilayer board 110. In FIG. 5, shapes of the ground conductor layer 113, the slits 181 and 182, the shielding conductor films 151 to 156 on the sides of the resin layer 114, and the shielding conductor film 169 are the same as those in FIG. 4.

Effects of the high-frequency module 100 configured as described above will be described. Note that, for the sake of simplicity, circuits are hereinafter denoted by the same reference numerals as those of regions in which the respective circuits are formed, and are referred to, for example, as a transmission circuit 120, an antenna circuit 130, and a reception circuit 140.

Figure 6:
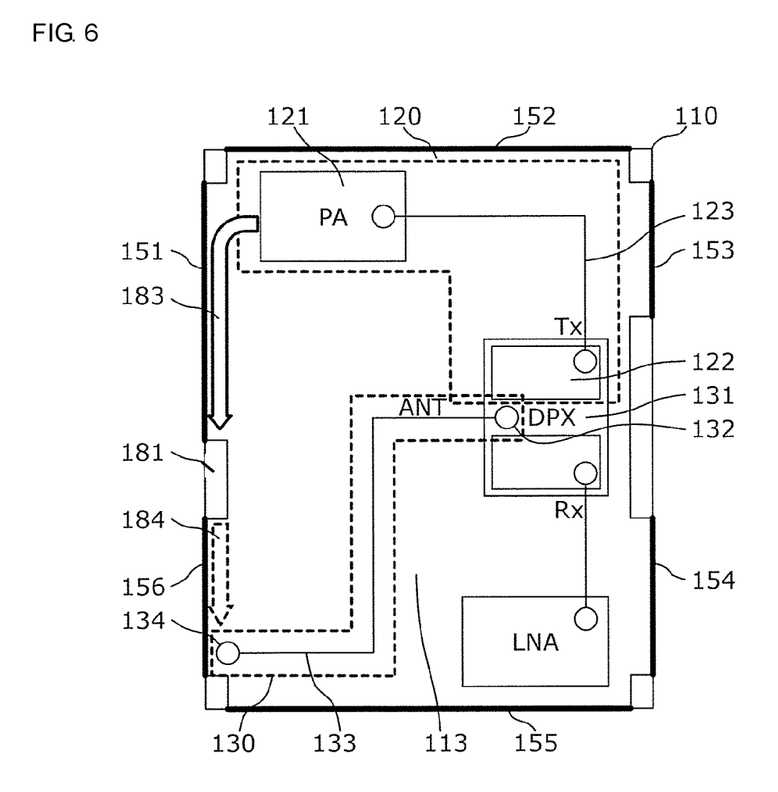
FIG. 6 is a plan view illustrating an example of effects of the high-frequency module according to the embodiment.

FIG. 6 is a plan view illustrating an example of effects of the slit 181 in the high-frequency module 100.

Within a high-frequency module, it has been learned that an unintended signal path is likely to be formed in a portion where a ground conductor layer and a shielding conductor film are in contact with each other.

For example, when the ground conductor layer and the shielding conductor film are in contact with each other in a portion of the side of a multilayer board closest both to a transmission circuit 120 and to an antenna circuit 130, transmission signals 183 and 184 including a harmonic wave before being subjected to filter processing in the transmission circuit 120 are transmitted to the antenna circuit 130 through the ground conductor layer and the shielding conductor film in some cases.

This results in unintended signal transmission that occurs between the transmission circuit 120 and the antenna circuit 130, and a concern arises about deterioration in spurious characteristics.

In this respect, in the high-frequency module 100, in the ground conductor layer 113, there is provided the slit 181 along a portion of the side of the multilayer board 110 closest both to the transmission circuit 120 and to the antenna circuit 130.

Thus, when the ground conductor layer 113 is kept from coming into contact with the shielding conductor films 151 to 156 by the slit 181, the strength of the ground, that is, impedance is adjusted, thereby making it possible to keep an unintended signal path from being formed between the transmission circuit 120 and the antenna circuit 130. This keeps the transmission signals 183 and 184 from being unintentionally transmitted.

As a result, the high-frequency module 100 is obtained that inhibits deterioration in circuit characteristics, such as spurious characteristics, caused when the transmission signals 183 and 184 are unintentionally transmitted and is excellent in circuit characteristics.

Figure 7:
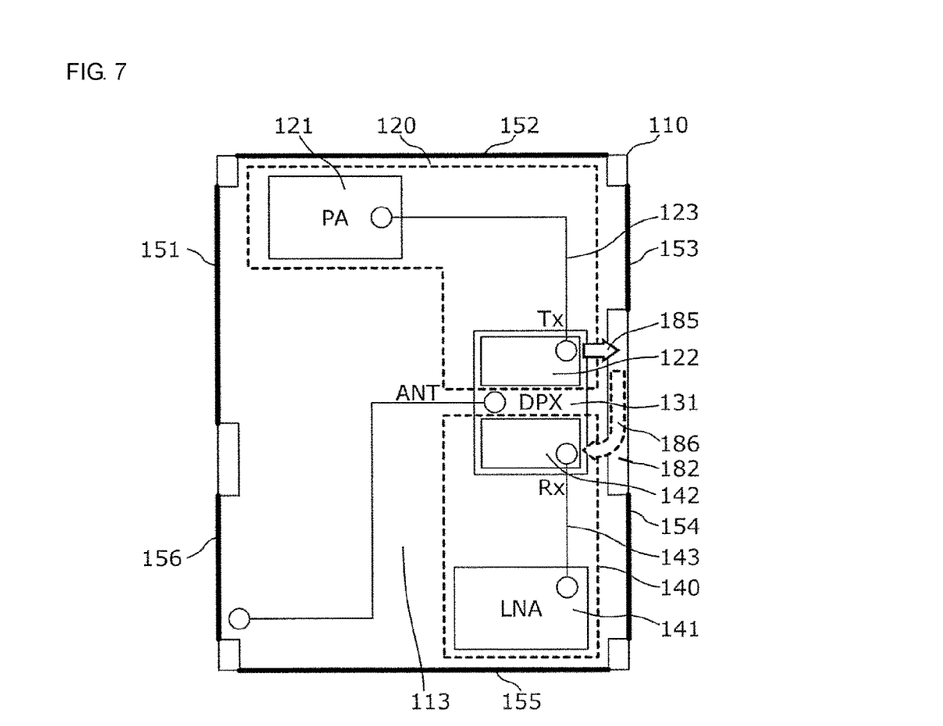
FIG. 7 is a plan view illustrating an example of effects of the high-frequency module according to the embodiment.

FIG. 7 is a plan view illustrating an example of effects of the slit 182 in the high-frequency module 100.

For example, when the ground conductor layer and the shielding conductor film are in contact with each other in a portion of the side of the multilayer board closest both to the transmission circuit 120 and to a reception circuit 140, transmission signals 185 and 186 having passed through the ground conductor layer are transmitted to the reception circuit 140, such as a low noise amplifier, through the shielding conductor film in some cases.

This results in unintended signal transmission that occurs between the transmission circuit 120 and the reception circuit 140, causing deterioration of reception sensitivity.

In this respect, in the high-frequency module 100, in the ground conductor layer 113, there is provided the slit 182 along a portion of the side of the multilayer board 110 closest both to the transmission circuit 120 and to the reception circuit 140.

Thus, when the ground conductor layer 113 is kept from coming into contact with the shielding conductor films 151 to 156 by the slit 182, the strength of the ground, that is, impedance is adjusted, thereby making it possible to keep an unintended signal path from being formed between the transmission circuit 120 and the reception circuit 140. This keeps the transmission signals 185 and 186 from being unintentionally transmitted.

As a result, the high-frequency module 100 is obtained that inhibits deterioration in circuit characteristics, such as isolation characteristics, caused when the transmission signals 185 and 186 are unintentionally transmitted and is excellent in circuit characteristics.

Furthermore, the length of the slit 182 is longer than the length of the side of the duplexer 131 opposite to the slit 182.

This configuration allows the slit 182 to be provided along the entire length of the duplexer 131 and can therefore inhibit unintended signal transmission between the transmission filter 122 and the reception filter 142 that are included in the duplexer 131 more effectively and inhibit deterioration in circuit characteristics.

Incidentally, it is determined, in accordance with a balance between a demanded shielding effect and an effect of inhibiting unintended signal transmission, whether to form a shielding conductor film in portions of the sides of the multilayer board 110 corresponding to the slits 181 and 182, that is, whether to employ the structure in FIG. 4 or the structure in FIG. 5.

In other words, as illustrated in FIG. 4, the structure in which no shielding conductor film is formed in the portions corresponding to the slits 181 and 182 inhibits not only unintended signal transmission that occurs through the ground conductor layer 113 but also unintended signal transmission that occurs through a shielding conductor film and can therefore inhibit deterioration in circuit characteristics more effectively.

Furthermore, as illustrated in FIG. 5, the structure in which the shielding conductor films 162 and 165 are formed in the portions corresponding to the slits 181 and 182 can produce a larger shielding effect while inhibiting unintended signal transmission that occurs through the ground conductor layer 113.

Second Embodiment

In a second embodiment, a communication device will be described that includes a front-end circuit including the high-frequency module according to the first embodiment.

Figure 8:
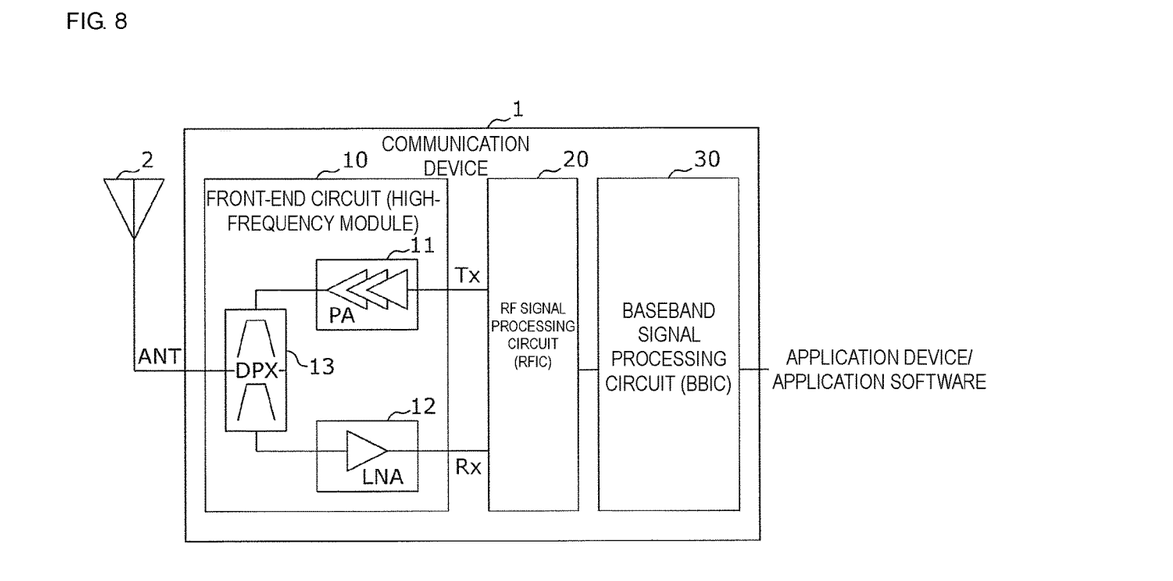
FIG. 8 is a block diagram illustrating an example of a functional configuration of a communication device according to an embodiment.

FIG. 8 is a block diagram illustrating an example of a functional configuration of a communication device 1 according to the second embodiment. As illustrated in FIG. 8, the communication device 1 includes a front-end circuit 10, an RF signal processing circuit 20, and a baseband signal processing circuit 30.

The front-end circuit 10 includes a power amplifier 11, a low noise amplifier 12, and a duplexer 13. For the front-end circuit 10, the high-frequency module 100 described in the first embodiment is used.

In the front-end circuit 10, the power amplifier 11 amplifies a transmission RF signal Tx received from the RF signal processing circuit 20.

The duplexer 13 supplies the transmission RF signal Tx amplified by the power amplifier 11 to an antenna circuit and also supplies a reception RF signal Rx supplied from the antenna circuit to the low noise amplifier 12. An antenna 2 may be included in the communication device 1.

The low noise amplifier 12 amplifies the reception RF signal Rx supplied from the duplexer 13 and supplies the amplified reception RF signal Rx to the RF signal processing circuit 20.

The RF signal processing circuit 20 converts a transmission signal received from the baseband signal processing circuit 30 into a transmission RF signal Tx and supplies the transmission RF signal Tx to the front-end circuit 10. The conversion may include modulation and up-conversion of a signal. Furthermore, the RF signal processing circuit 20 converts the reception RF signal Rx received from the front-end circuit 10 into a reception signal and supplies the reception signal to the baseband signal processing circuit 30. The conversion may include demodulation and down-conversion of a signal. The RF signal processing circuit 20 may be constituted by a radio frequency integrated circuit (RFIC) chip.

The baseband signal processing circuit 30 converts, into a transmission signal, transmission data generated by an application device/application software that provides a voice call, an image display, and so forth, and supplies the transmission signal to the RF signal processing circuit 20. The conversion may include data compression, data multiplexing, and addition of an error correction code. Furthermore, the baseband signal processing circuit 30 converts the reception signal received from the RF signal processing circuit 20 into reception data and supplies the reception data to the application device/application software. The conversion may include data decompression, data demultiplexing, and error correction. The baseband signal processing circuit 30 may be constituted by a baseband integrated circuit (BBIC) chip.

The communication device 1 allows a high-performance communication device to be obtained by using, for the front-end circuit 10, the high-frequency module 100 that is excellent in circuit characteristics.

Although the high-frequency module and the communication device according to the embodiments of the present disclosure have been described above, the present disclosure is not limited to each embodiment. Embodiments obtained by making various modifications conceived by a person skilled in the art to the present embodiments, or embodiments formed by combining components in different embodiments may also be included in the scope of one or a plurality of aspects of the present disclosure as long as they do not depart from the gist of the present disclosure.

The present disclosure can be widely used, as a high-frequency module, in various communication devices.

1 communication device
2 antenna
10 front-end circuit
11 power amplifier
12 low noise amplifier
13 duplexer
20 RF signal processing circuit
30 baseband signal processing circuit
100 high-frequency module
110 multilayer board
111, 112 insulator layer
113 ground conductor layer
114 resin layer
120 transmission circuit (region in which transmission circuit is formed)
121 power amplifier
122 transmission filter
123 wiring pattern
130 antenna circuit (region in which antenna circuit is formed)
131 duplexer
132 antenna terminal
133 wiring pattern
134 connection terminal
140 reception circuit (region in which reception circuit is formed)
141 low noise amplifier
142 reception filter
143 wiring pattern
151 to 156, 161 to 165, 169 shielding conductor film
181, 182 slit
183 to 186 transmission signal

The invention claimed is:

1. A high-frequency module comprising:
a multilayer board including a plurality of insulator layers and at least one ground conductor layer;
a first circuit provided in a first region of the multilayer board;
a second circuit provided in a second region of the multilayer board, wherein the second region is a region different from the first region; and
a shielding conductor film provided on a side of the multilayer board and being partially in contact with the ground conductor layer,
wherein the ground conductor layer is not in contact with the shielding conductor film in a portion of the side of the multilayer board closest both to the first region and to the second region.

2. The high-frequency module according to claim 1, wherein the first circuit is a transmission circuit, and the second circuit is an antenna circuit.

3. The high-frequency module according to claim 2, wherein the shielding conductor film is not provided in the portion of the side of the multilayer board.

4. A communication device comprising:
the high-frequency module according to claim 2; and
a radio frequency signal processing circuit connected to the high-frequency module.

5. The high-frequency module according to claim 1, wherein the first circuit is a transmission circuit, and the second circuit is a reception circuit.

6. The high-frequency module according to claim 5, wherein the transmission circuit includes a transmission filter,
wherein the reception circuit includes a reception filter,
wherein the transmission filter and the reception filter are built into a single duplexer component,
wherein the portion is a part of the side of the multilayer board to which the duplexer component is closest, and
wherein, when the multilayer board is viewed in plan, a length of the portion is longer than a length of a side of the duplexer component opposite to the portion.

7. The high-frequency module according to claim 6, wherein the shielding conductor film is not provided in the portion of the side of the multilayer board.

8. A communication device comprising:
the high-frequency module according to claim 6; and
a radio frequency signal processing circuit connected to the high-frequency module.

9. The high-frequency module according to claim 5, wherein the shielding conductor film is not provided in the portion of the side of the multilayer board.

10. A communication device comprising:
the high-frequency module according to claim 5; and
a radio frequency signal processing circuit connected to the high-frequency module.

11. The high-frequency module according to claim 1, wherein the shielding conductor film is not provided in the portion of the side of the multilayer board.

12. A communication device comprising:
the high-frequency module according to claim 11; and a radio frequency signal processing circuit connected to the high-frequency module.

13. A communication device comprising:

the high-frequency module according to claim 1; and a radio frequency signal processing circuit connected to the high-frequency module.

\* \* \* \* \*